United States Patent
Lee et al.

(10) Patent No.: US 12,309,951 B2
(45) Date of Patent: May 20, 2025

(54) DISPLAY APPARATUS

(71) Applicant: SAMSUNG ELECTRONICS CO., LTD., Suwon-si (KR)

(72) Inventors: Sanggoo Lee, Suwon-si (KR); Sunggi Kim, Suwon-si (KR); Daesik Park, Suwon-si (KR); Hyewon Song, Suwon-si (KR); Hyunwoong Yun, Suwon-si (KR); Jeongroh Lee, Suwon-si (KR); Woosung In, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 18/110,704

(22) Filed: Feb. 16, 2023

(65) Prior Publication Data
US 2023/0337382 A1 Oct. 19, 2023

Related U.S. Application Data

(63) Continuation of application No. PCT/KR2023/000876, filed on Jan. 8, 2023.

(30) Foreign Application Priority Data

Apr. 19, 2022 (KR) .................. 10-2022-0048030
May 18, 2022 (KR) .................. 10-2022-0060878

(51) Int. Cl.
*H05K 5/02* (2006.01)

(52) U.S. Cl.
CPC .................. *H05K 5/0234* (2013.01)

(58) Field of Classification Search
CPC .. H05K 5/0234; F16M 11/046; F16M 11/105; F16M 11/125; F16M 11/2021; F16M 11/24
See application file for complete search history.

(56) References Cited

U.S. PATENT DOCUMENTS 6,189,850 B1   2/2001 Liao et al.
6,822,857 B2  11/2004 Jung et al.
(Continued)

FOREIGN PATENT DOCUMENTS

CN   101881365 A  11/2010
JP    11-7250 A    1/1999
(Continued)

OTHER PUBLICATIONS

Search Report (PCT/ISA/210) issued May 15, 2023 by the International Searching Authority for International Patent Application No. PCT/KR2023/000876.
(Continued)

*Primary Examiner* — Sagar Shrestha
(74) *Attorney, Agent, or Firm* — Sughrue Mion, PLLC

(57) ABSTRACT

A display apparatus is provided. The display apparatus includes: a display panel; a support bracket coupled to the display panel; a support arm coupled to the support bracket and supporting the display panel, wherein the support arm is configured to rotate between a first and second orientations; and a support stand supporting the support arm and defining a limiting groove, the support stand being configured to allow the support arm to move along a vertical direction. The support arm includes a limiting link configured to be in a first position that is offset from the limiting groove when the display panel is in the first orientation and a second position extending into the limiting groove when the display panel is in the second orientation.

19 Claims, 13 Drawing Sheets

(56) References Cited

U.S. PATENT DOCUMENTS

| | | |
|---|---|---|
| 7,424,991 B2 | 9/2008 | Kim et al. |
| 7,430,113 B2 | 9/2008 | McRight et al. |
| 7,490,796 B2 | 2/2009 | Kim |
| 7,643,276 B2 | 1/2010 | Shin |
| 7,815,154 B2 | 10/2010 | Oh et al. |
| 7,963,488 B2 | 6/2011 | Hasegawa et al. |
| 8,011,623 B2 | 9/2011 | Hwang et al. |
| 9,279,537 B2* | 3/2016 | Hung .................... F16M 11/425 |
| 9,528,653 B1* | 12/2016 | Hsu ...................... F16M 11/105 |
| 10,101,770 B2* | 10/2018 | Schatz .................. G06F 1/1632 |
| 11,174,984 B2 | 11/2021 | Kim |
| 11,619,339 B2* | 4/2023 | Lee ........................ F16M 11/18 |
| | | 248/550 |
| 11,644,863 B2* | 5/2023 | Na ...................... F16M 11/105 |
| | | 361/679.21 |
| 2007/0064379 A1 | 3/2007 | Shin |
| 2007/0064380 A1* | 3/2007 | Shin ...................... F16M 11/24 |
| | | 248/917 |
| 2007/0262209 A1 | 11/2007 | She et al. |
| 2012/0236475 A1* | 9/2012 | Peng .................. F16M 11/2021 |
| | | 361/679.01 |
| 2013/0279090 A1* | 10/2013 | Brandt .................. F16M 11/04 |
| | | 361/679.01 |
| 2014/0168884 A1* | 6/2014 | Wylie .................. G06F 1/1632 |
| | | 361/679.43 |
| 2015/0211675 A1* | 7/2015 | Shyu .................... F16M 11/105 |
| | | 248/125.7 |
| 2015/0354746 A1* | 12/2015 | Hung .................. F16M 11/425 |
| | | 248/200.1 |
| 2017/0037996 A1* | 2/2017 | Yeh ........................ F16M 11/10 |
| 2020/0053891 A1* | 2/2020 | Kim ...................... F16M 11/22 |
| 2020/0081483 A1* | 3/2020 | Laurent .................. F16M 11/10 |
| 2021/0088174 A1 | 3/2021 | Gurr et al. |
| 2022/0282824 A1 | 9/2022 | Hsu |
| 2023/0324953 A1* | 10/2023 | Kim ....................... G06F 1/1601 |
| 2023/0333589 A1* | 10/2023 | Lee ........................ G06F 1/1607 |

FOREIGN PATENT DOCUMENTS

| | | | |
|---|---|---|---|
| JP | 11-65467 A | 3/1999 | |
| JP | H11-153960 A | 6/1999 | |
| JP | 2004-70279 A | 3/2004 | |
| JP | 4741846 B2 | 8/2011 | |
| JP | 5452076 B2 | 3/2014 | |
| JP | 2016-31441 A | 3/2016 | |
| JP | 2020-134927 A | 8/2020 | |
| KR | 10-2004-0013886 A | 2/2004 | |
| KR | 10-0435232 B1 | 6/2004 | |
| KR | 10-2004-0096309 A | 11/2004 | |
| KR | 10-0476090 B1 | 3/2005 | |
| KR | 10-0512718 B1 | 9/2005 | |
| KR | 10-0565686 B1 | 3/2006 | |
| KR | 10-2007-0033210 A | 3/2007 | |
| KR | 10-2007-0033703 A | 3/2007 | |
| KR | 10-1253569 B1 | 4/2013 | |
| KR | 10-1370335 B1 | 3/2014 | |
| KR | 10-1399209 B1 | 6/2014 | |
| KR | 10-1707110 B1 | 2/2017 | |
| KR | 10-1725394 B1 | 4/2017 | |
| KR | 10-2019-0019021 A | 2/2019 | |
| WO | 2006/030487 A1 | 3/2006 | |
| WO | 2020/170948 A1 | 8/2020 | |

OTHER PUBLICATIONS

Written Opinion (PCT/ISA/237) issued May 15, 2023 by the International Searching Authority for International Patent Application No. PCT/KR2023/000876.

* cited by examiner

DISPLAY APPARATUS

CROSS-REFERENCE TO RELATED APPLICATION(S)

This is a continuation of International Application No. PCT/KR2023/000876, filed on Jan. 18, 2023, which is based on and claims priority to Korean Patent Application No. 10-2022-0048030, filed on Apr. 19, 2022, in the Korean Intellectual Property Office, and Korean Patent Application No. 10-2022-0060878, filed on May 18, 2022, in the Korean Intellectual Property Office, the disclosures of which are incorporated herein by reference in their entireties.

BACKGROUND

1. Field

The disclosure relates to a display apparatus including a display module and a support device for supporting the display module to enable a rotation and an upward and downward movement of the display module.

2. Description of Related Art

A display apparatus is an output apparatus for converting acquired or stored electrical information into visual information and displaying the converted electrical information to a user.

The display apparatus may include a display module for displaying an image and a support device for supporting the display module. The support device may be provided to support the display module so that a front surface of the display module faces the user.

The support device may support the display module to be movable upward and downward within a predetermined range. In addition, the support device may support the display module to perform a pivot rotation. Accordingly, the display module may pivot between a landscape orientation in which the long side of the display module is horizontally arranged and a portrait orientation in which the long side of the display module is vertically arranged.

When the display module in a portrait orientation has the same vertical movement range as that in a landscape orientation, the display module in a portrait orientation may collide with the floor surface due to a downward movement, which may damage the display module.

SUMMARY

According to embodiments of the disclosure, a display apparatus may prevent a display module from colliding with a floor surface due to a downward movement.

According to embodiments of the disclosure, a display apparatus has different vertical movement ranges based on whether the display module is in a landscape orientation or a portrait orientation.

According to embodiments of the disclosure, a display apparatus includes a support device for limiting a vertical movement range of a display module in a portrait orientation.

The technical objectives of the disclosure are not limited to the above, and other objectives may become apparent to those of ordinary skill in the art based on the following descriptions.

In accordance with an aspect of the disclosure, a display apparatus includes: a display panel; a support bracket coupled to a rear surface of the display panel; a support arm coupled to the support bracket and supporting the display panel, wherein the support arm is configured to rotate between a first orientation in which a long side of the display panel is laterally disposed and a second orientation in which the long side of the display panel is longitudinally disposed; and a support stand supporting the support arm and defining a limiting groove, the support stand being configured to allow the support arm to move along a vertical direction. The support arm comprises a limiting link configured to be in a first position that is offset from the limiting groove when the display panel is in the first orientation and a second position extending into the limiting groove when the display panel is in the second orientation.

The support arm may further include a fixing link coupled to the support stand to be movable upward and downward, and the limiting link may be provided to be movable forward and backward with respect to the fixing link.

The limiting link may be configured to move between the first position and the second position by laterally moving along a horizontal direction.

The support arm may further include an elastic member configured to bias the limiting link to the first position.

One end of the elastic member may be connected to the fixing link, and another end of the elastic member may be connected to the limiting link.

The support bracket may include a link guide portion defining a sloped surface for guiding the limiting link to move between the first position and the second position as the display panel rotates.

The limiting link may include: a guide protrusion in contact with the link guide portion and configured to slide along the link guide portion; a link body extending from the guide protrusion and slidably coupled to the fixing link; and a limiting protrusion extending from the link body, and configured to be inserted into the limiting groove when the display panel is in the first orientation and be withdrawn from the limiting groove when the display panel is in the second orientation.

The link guide portion may define a link guide groove that is maximally depressed forward at a location of the guide protrusion when the display panel is in the first orientation and minimally depressed forward at a location of the guide protrusion when the display panel is in the second orientation.

The link guide portion may include a link guide protrusion that is minimally protruded backward when the display panel is in the first orientation and maximally protruded backward when the display panel is in the second orientation.

The link guide portion may be configured to: guide the limiting link from the first position to the second position when the display panel rotates from the first orientation to the second orientation; and guide the limiting link from the second position to the first position when the display panel rotates from the second orientation to the first orientation.

When the limiting protrusion is inserted into the limiting groove, a downward movement range of the display panel may be limited within a first range, and when the limiting protrusion is withdrawn from the limiting groove, the limitation of the downward movement range of the display panel may be limited within a second range that comprises the first range.

The support stand may include a reinforcing plate adjacent to the rear surface of the support stand inside the support stand, and configured to reinforce a strength, and the limiting groove may be defined by the reinforcing plate.

The limiting groove may have an upper side that is open.

In accordance with an aspect of the disclosure, a display stand includes: a support bracket configured to support a display panel and rotate between a first orientation and a second orientation; a support arm configured to support the support bracket and comprising a limiting link; and a support stand configured to slidably support the support arm within a first vertical range based on the support bracket being in the first orientation and to slidably support the support bracket within a second vertical range based on the support bracket being in the second orientation. The first vertical range is different than and includes the second vertical range.

The limiting link may be configured to move along a horizontal direction relative to the support stand based on the support bracket rotating between the first orientation and the second orientation.

The support stand may include a reinforcing plate which defines a groove.

The limiting link may be offset from the groove along a vertical direction based on the support bracket being in the first orientation, and the limiting link may overlap the groove along the vertical direction based on the support bracket being in the second orientation.

The limiting link may be configured to contact a lower surface of the groove based on the support arm being positioned at a lower end of the second vertical range while the support bracket is in the second orientation.

In accordance with an aspect of the disclosure, a method of limiting vertical motion of a support bracket with respect to a support stand, includes: allowing the support bracket to vertically move along the support stand within a first vertical range based on the support bracket being in a first orientation; rotating the support bracket from the first orientation to a second orientation; and limiting vertical movement of the support bracket a second vertical range, wherein the first vertical range is different than and comprises the second vertical range.

A support arm may be provided between the support bracket and the support stand, and the method may further include moving a portion of the support arm from a first position that is offset from a groove defined in the support stand along a vertical direction, to a second position that overlaps the groove along the vertical direction, based on the support bracket rotating from the first orientation to the second orientation.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
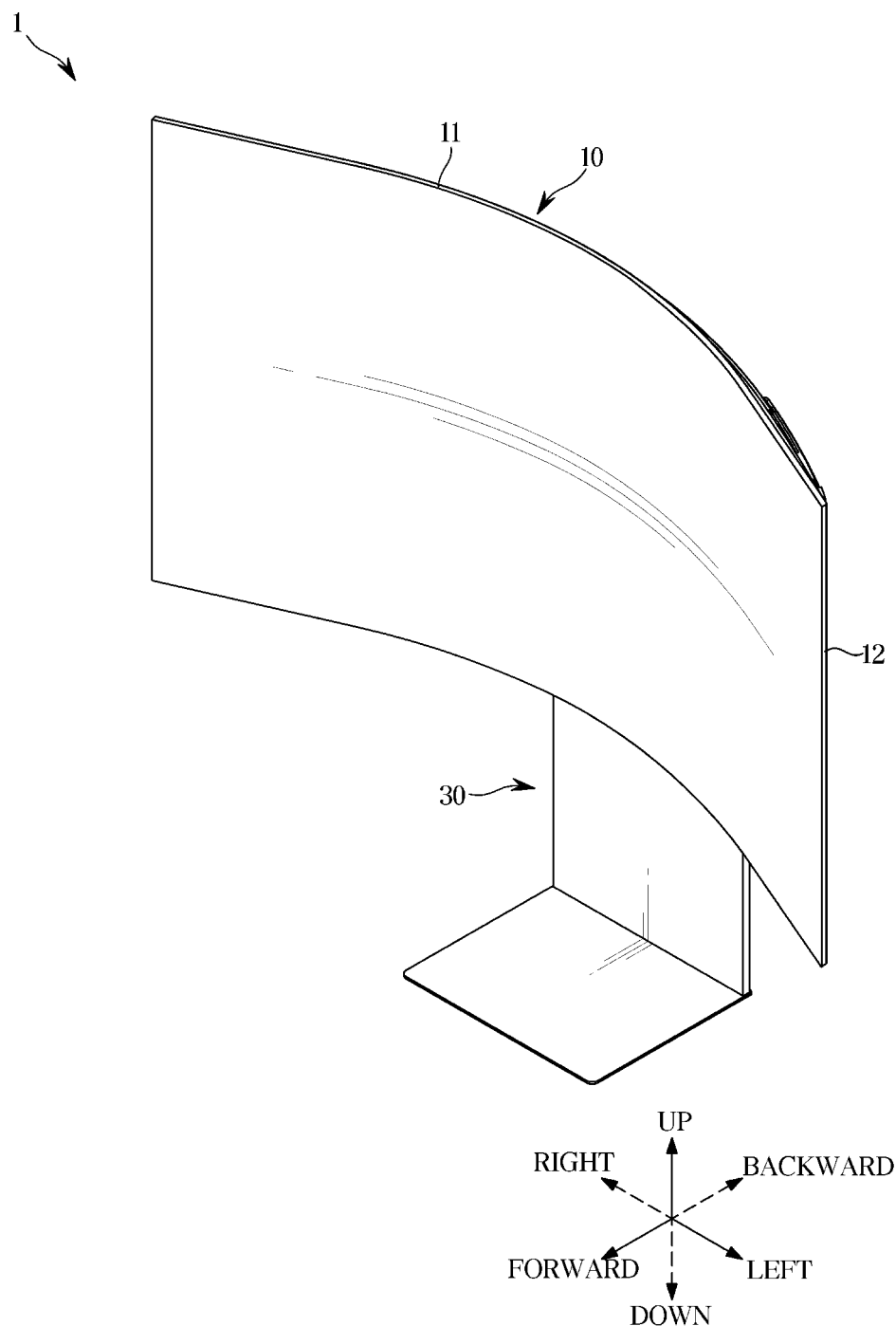
FIG. 1 is a perspective view illustrating a display apparatus according to an embodiment.

Embodiments described in the specification and configurations shown in the accompanying drawings are provided as examples, and various modifications may replace the embodiments and the drawings of the disclosure at the time of filing of the application.

Further, identical symbols or numbers in the drawings of the disclosure denote components or elements configured to perform substantially identical functions.

Further, terms used herein are only for the purpose of describing particular embodiments and are not intended to limit to the disclosure. The singular form is intended to include the plural form as well, unless the context clearly indicates otherwise. It should be further understood that the terms "include," "including," "have," and/or "having" specify the presence of stated features, integers, steps, operations, elements, components, and/or groups thereof, but do not preclude the presence or addition of one or more other features, integers, steps, operations, elements, components, and/or groups thereof.

Further, it should be understood that, although the terms "first," "second," etc. may be used herein to describe various elements, the elements are not restricted by the terms, and the terms are only used to distinguish one element from another. For example, a first element could be termed a second element, and similarly, a second element could be termed a first element without departing from the scope of the disclosure. The term "and/or" includes combinations of one or all of a plurality of associated listed items.

The terms "front", "rear", "back", "left", "right", and the like as used herein are defined with respect to the drawings, but the terms may not restrict the shape and position of the respective components.

Hereinafter, embodiments will be described in detail with reference to the accompanying drawings.

FIG. 1 is a perspective view illustrating a display apparatus according to an embodiment.

A display module 10 is a device capable of processing an image signal and visually displaying a processed image. The processed image may include information, reference materials, data, and the like as characters, figures, graphs, images, and the like. The display module 10 may include a television, a monitor, and the like.

The display module 10 may be configured to display a screen. The display module 10 may include a self-emissive display panel, such as an organic light-emitting diode (OLED) or a non-emissive display panel, such as a liquid crystal display (LCD). There is no particular limitation on the type of the display panel.

Figure 2:
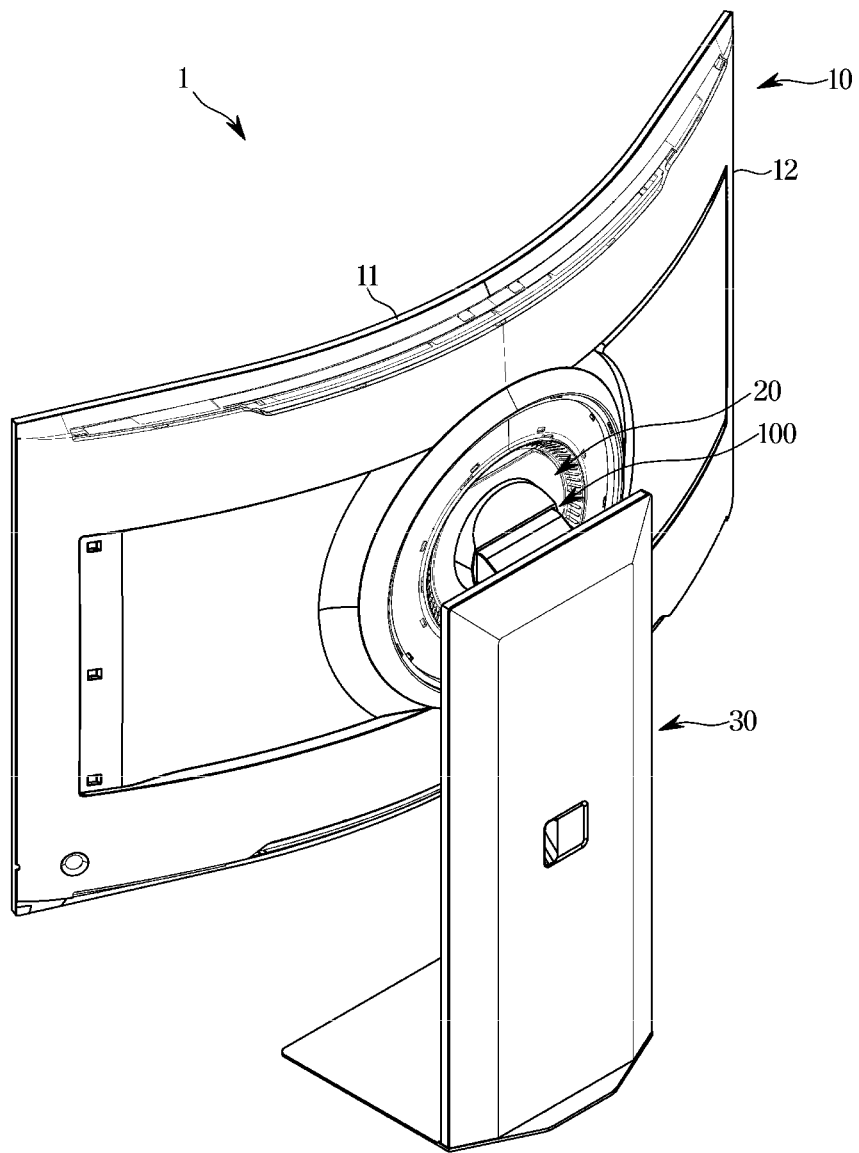
FIG. 2 is a rear perspective view illustrating the display apparatus shown in FIG. 1 according to an embodiment.
Figure 2:
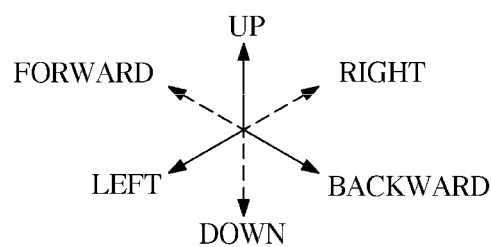
Figure 3:
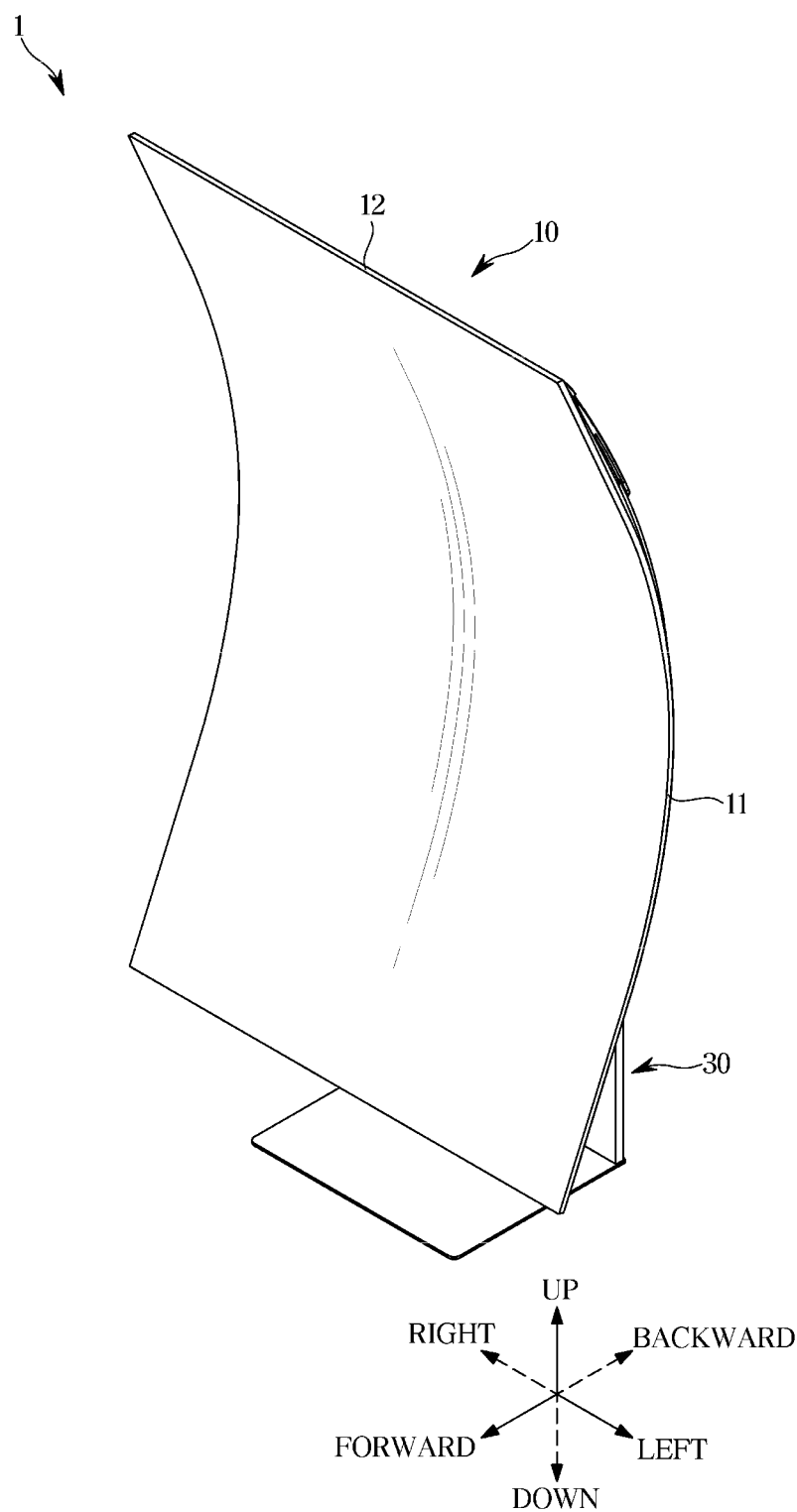
FIG. 3 is a perspective view illustrating a display apparatus according to an embodiment.

The display module 10 may be provided so that the length of a lateral side and the length of a longitudinal side are different from each other. That is, the display module 10 may be provided to have a long side 11 and a short side 12. The display module 10 may be provided in a rectangular plate shape. In addition, as shown in FIGS. 1 to 3, the display module 10 may be provided as a curved display in which the long side 11 is formed in a rounded shape. Alternatively, the display module 10 may be provided as a flat display in which the long side 11 is provided as a straight line.

According to an embodiment, the display apparatus 1 may include a display module 10 and support devices 20, 100, and 30 supporting the display module 10.

The support devices 20, 100, and 30 may include a support bracket 20, a support arm 100, and a support stand 30.

Referring to FIG. 2, the support bracket 20 may be coupled to a rear side of the display module 10. The support arm 100 may be coupled to the support bracket 20 to support the display module 10. The support arm 100 may support the display module 10 such that the display module 10 may pivot. The support arm 100 may be coupled to the support stand 30 to be movable in an up direction and a down direction (a vertical direction) within a predetermined range.

Referring to FIGS. 1 and 3, the display module 10 may be positioned in any one of a first orientation in which the long side 11 is laterally disposed and a second orientation in which the long side 11 is longitudinally disposed. The display module 10 may be positioned in the second orientation by pivot-rotating from the first orientation, and may be positioned in the first orientation by pivot-rotating from the second orientation. Hereinafter, "pivot rotation" may be expressed as "rotation".

The support arm 100 may support the support bracket 20 and the display module 10 coupled to the support bracket 20 for rotation between the first orientation and the second orientation. The first orientation may be referred to as a landscape orientation, and the second orientation may be referred to as a portrait orientation.

The support arm 100 may be coupled to the support stand 30 to be movable in the vertical direction from a lowermost end of the support stand 30 to an uppermost end of the support stand 30. As the support arm 100 moves vertically with respect to the support stand 30, the support bracket 20 and the display module 10 coupled to the support arm 100 may be vertically moved with respect to the support stand 30.

When the support arm 100 is positioned at the lowermost end of the support stand 30, the display module 10 arranged in the landscape orientation does not collide with the floor surface. This is because even when the display module 10 is positioned at the lowermost end of the support stand 30, the display module 10 is provided to be spaced apart from the floor surface by a predetermined distance in the vertical direction. In this case, the "floor surface" may refer to a physical space in which the support stand 30 is placed. The "floor surface", may refer to some area on a desk regardless of its name.

On the other hand, if the support arm 100 is positioned at the lowermost end of the support stand 30 while the display module 10 is arranged in the portrait orientation, the display module 10 may collide with the floor surface. This is because, when the display module 10 is arranged in the portrait orientation, the long side 11 of the display module 10 is longitudinally arranged and thus the separation distance from the floor surface is reduced compared to that in the landscape orientation.

Therefore, if the vertical movement range of the display module 10 in the portrait orientation is the same as that in the landscape orientation, a downward movement of the display module 10 in the portrait orientation may cause the display module 10 to collide with the floor surface, which may cause the display module 10 to be damaged.

In related devices, to prevent the display module arranged in the portrait orientation from colliding with the floor surface due to a downward movement, the user needs to limit the downward movement range of the display module. That is, the user needs to carefully adjust the height of the display module up to a height at which the display module does not touch the floor surface. However, when the user inadvertently moves the display module downward until the display module comes into contact with the floor surface, the display module may be damaged by colliding with the floor surface as described above.

According to an embodiment, the display module 10 may be prevented from colliding with the floor surface due to a downward movement. Specifically, by setting the vertical movement range of the display module 10 arranged in the landscape orientation to be different from that of the display module 10 arranged in the portrait orientation, a damage to the display module 10 may be prevented. In this regard, the display module 10 may be prevented from colliding with the floor surface by limiting the vertical movement range of the display module 10 arranged in the portrait orientation.

According to an embodiment, the vertical movement range within the support stand 30 of the display module 10 arranged in the landscape orientation may not be limited. On the other hand, the vertical movement range within the support stand 30 of the display module 10 arranged in the portrait orientation may be limited.

Figure 4:
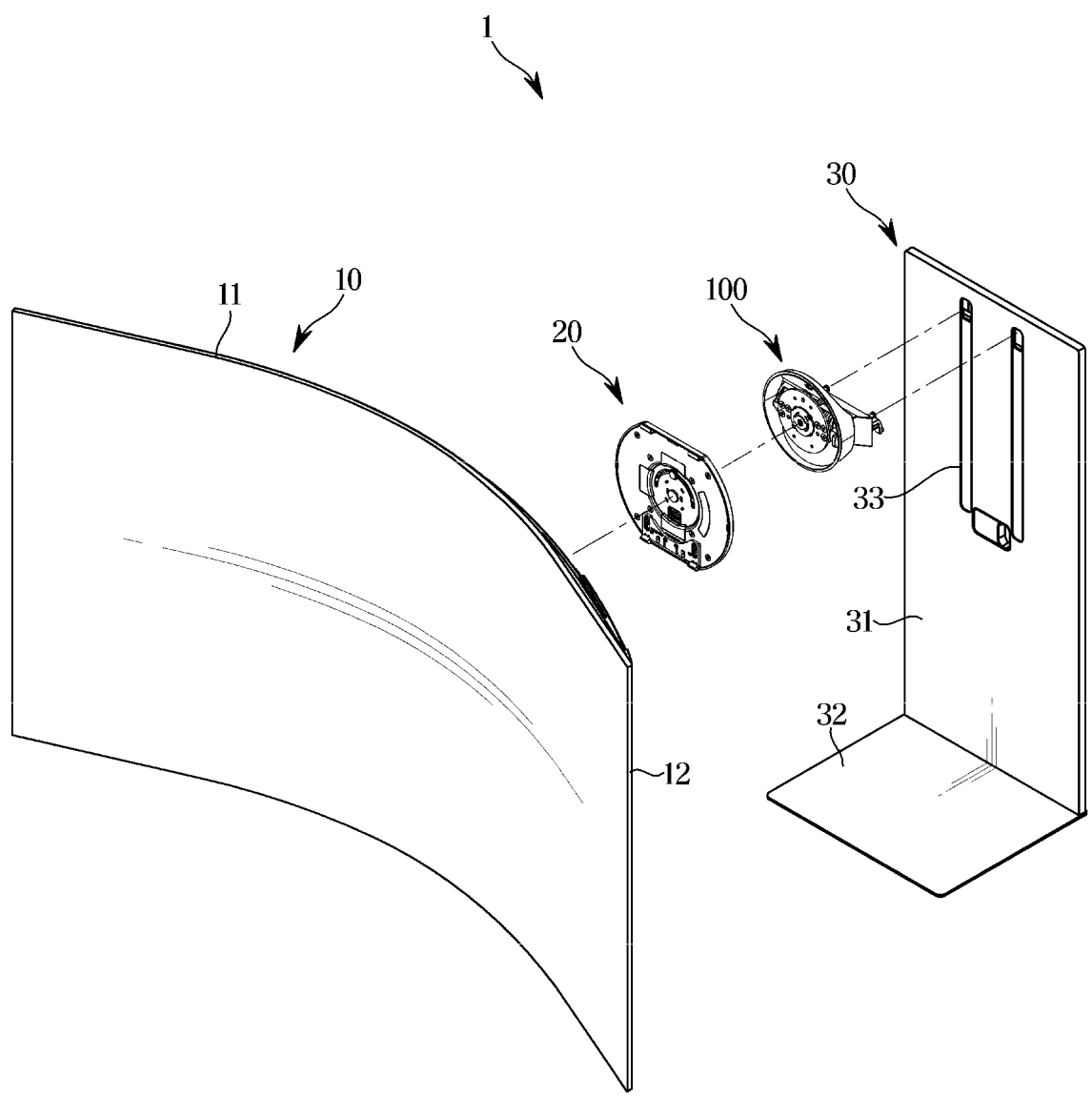
FIG. 4 is a front exploded perspective view illustrating a display apparatus according to an embodiment.
Figure 5:
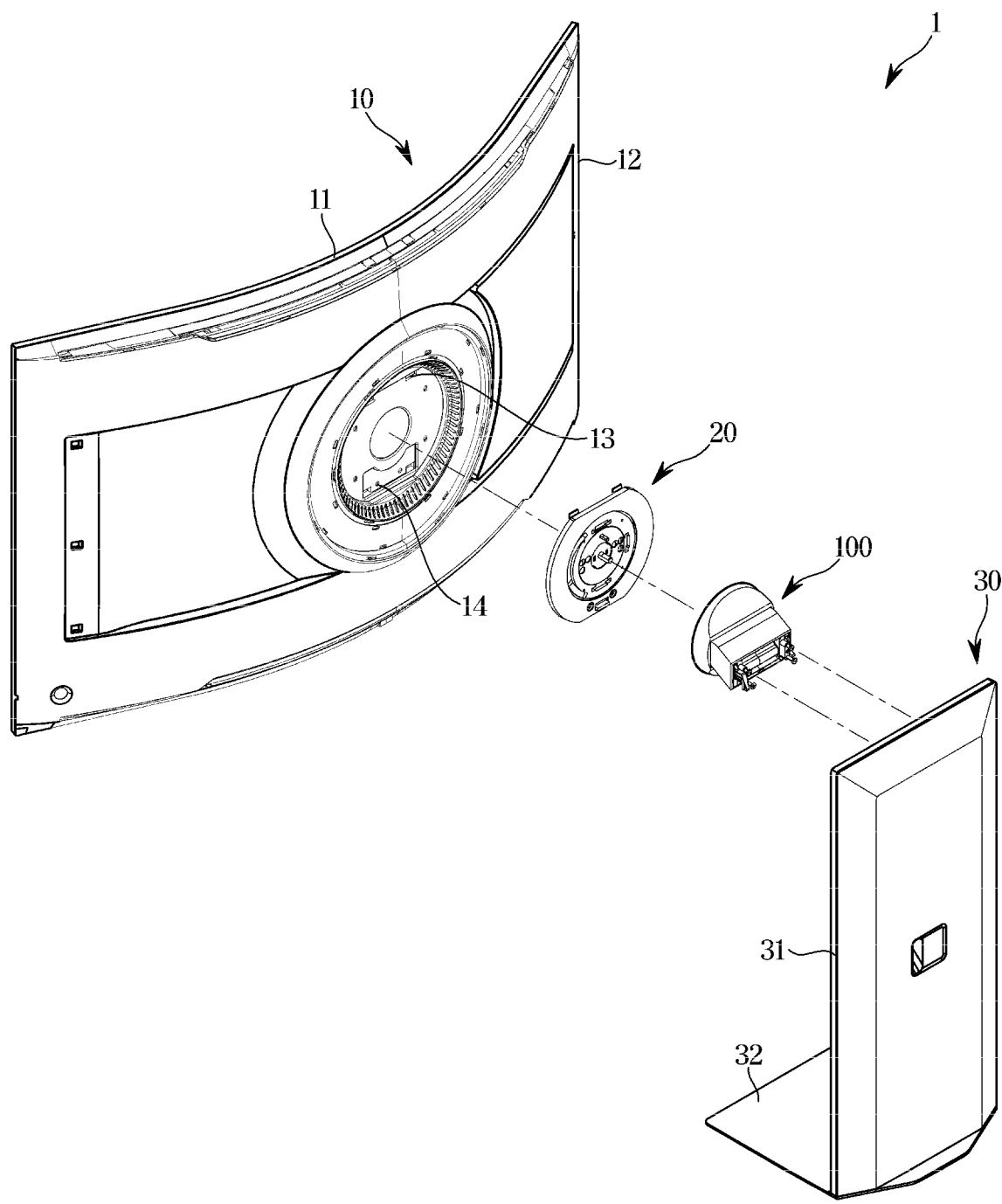
FIG. 5 is a rear exploded perspective view illustrating a display apparatus according to an embodiment.

FIG. 4 is a front exploded perspective view illustrating a display apparatus according to an embodiment. FIG. 5 is a rear exploded perspective view illustrating a display apparatus according to an embodiment.

Referring to FIGS. 4 and 5, the display apparatus 1 may include the display module 10 and the support devices 20, 100, and 30 for supporting the display module 10 to be rotatable and vertically movable.

The display module 10 may include an upper groove 13 and a lower groove 14 provided on a rear surface thereof.

The support devices 20, 100, and 30 include the support bracket 20 provided to be coupled to the rear surface of the display module 10, the support arm 100 coupled to the support bracket 20 and rotatably supporting the support bracket 20, and the support stand 30 coupled to the support arm 100 and supporting the support arm 100 to enable a upward and downward movement.

The support bracket 20 may be coupled to the rear surface of the display module 10 with an upper protrusion 21a and a lower protrusion 22a, which will be described below, being inserted into the upper groove 13 and lower groove 14 of the display module 10, respectively. The support bracket 20 may be coupled to the rear surface of the display module 10 without a separate fastener.

The support bracket 20 may be provided to be coupled to the display module 10 and the support arm 100. The support bracket 20 may be coupled to the display module 10 with the support arm 100 coupled thereto.

The support arm 100 may rotatably support the support bracket 20. The support arm 100 may rotatably support the support bracket 20 to thereby rotatably support the display module 10 coupled to the support bracket 20.

The support stand 30 may be provided to stand on the floor surface by itself. The support stand 30 may include a stand plate 32 provided to be in contact with the floor surface and a stand body 31 coupled to the support arm 100.

The stand body 31 may include a stand rail 33. The stand rail 33 may guide a vertical movement of the support arm 100 with respect to the stand body 31.

Figure 6:
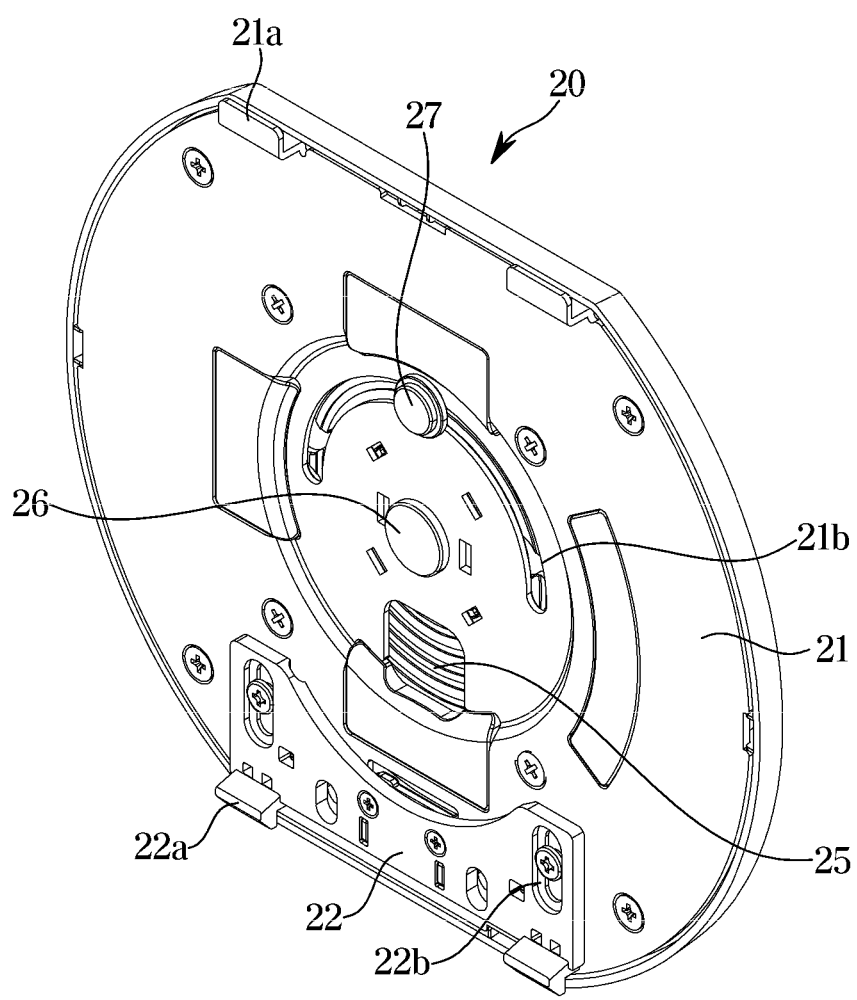
FIG. 6 is a view illustrating a support bracket of a display apparatus according to an embodiment.
Figure 7:
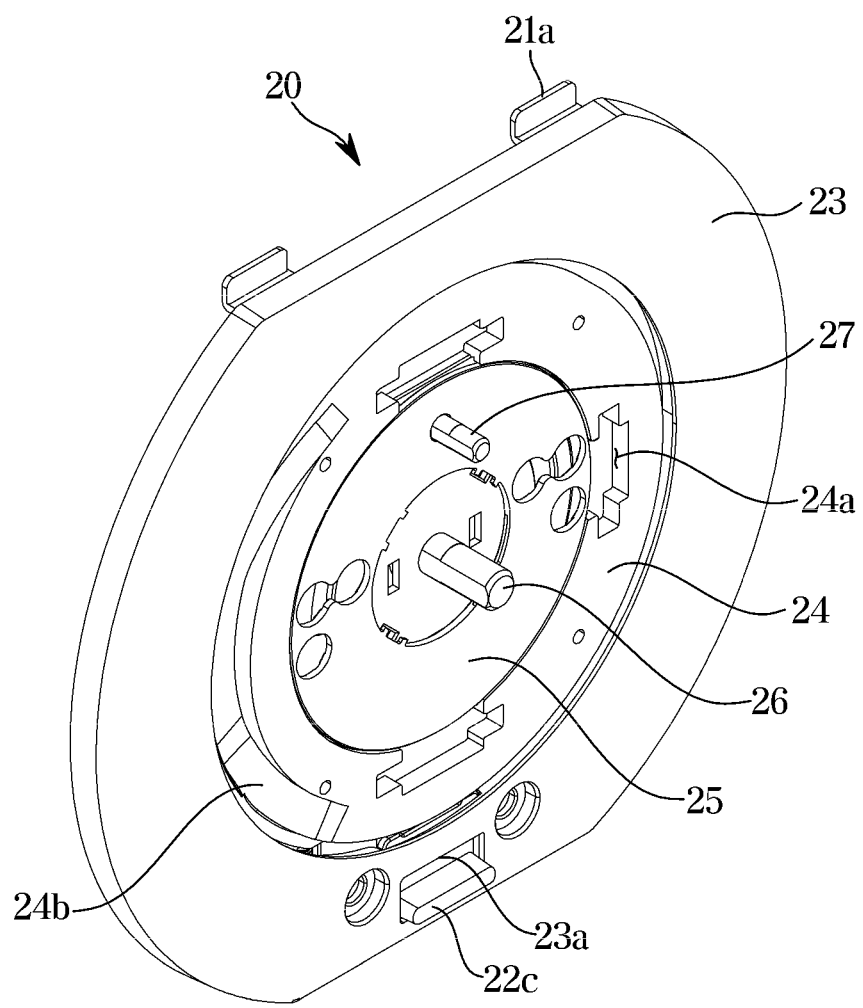
FIG. 7 is a view illustrating the support bracket shown in FIG. 6 according to an embodiment.

FIGS. 6 and 7 are views illustrating a support bracket of a display apparatus according to an embodiment.

Hereinafter, the support bracket 20 according to an embodiment will be described in detail with reference to FIGS. 6 and 7.

Referring to FIGS. 6 and 7, the support bracket 20 includes the upper protrusion 21a and the lower protrusion 22a provided to be respectively inserted into the upper groove 13 and the lower groove 14 of the display module 10. The support bracket 20 may include a moving bracket 22 that is provided to be movable upward and downward, with respect to the upper protrusion 21a, and includes the lower protrusion 22a. The moving bracket 22 may be provided to be movable upward and downward within a predetermined range, and may be elastically biased downward by an elastic member, such as an elastic band or an elastic cord, or by a spring.

According to an embodiment, the support bracket 20 may include a rotating bracket 21 provided to rotate together with the display module 10 and including the upper protrusion 21a, a moving bracket 22 coupled to be movable upward and downward with respect to the rotating bracket 21 and including the lower protrusion 22a, a guide bracket 24 coupled to the rotating bracket 21 to rotate together with the rotating bracket 21, a bracket cover 23 coupled to a rear surface of the rotating bracket 21, and a fixed bracket 25 coupled to the support arm 100 so as not to rotate together with the display module 10. In this regard, the rotating bracket 21 may rotate with respect to the fixed bracket 25.

The rotating bracket 21 may include the upper protrusion 21a provided on the upper end thereof. In addition, the rotating bracket 21 may include a guide hole 21b into which a second fixing member 27 to be described below is inserted. The guide hole 21b may be provided in an arc shape so that the second fixing member 27 may be fixed at a predetermined position even when the rotating bracket 21 rotates.

The moving bracket 22 may be coupled to a lower end of the rotating bracket 21. The moving bracket 22 may be coupled to the rotating bracket 21 to be movable upward and downward with respect to the rotating bracket 21. The moving bracket 22 may be elastically biased downward by an elastic member, such as an elastic band or an elastic cord, or by a spring. The moving bracket 22 may include a lower protrusion 22a and a coupling hole 22b through which a coupling member for coupling the moving bracket 22 and the rotating bracket 21 passes. The coupling member may move upward and downward within the coupling hole 22b. The coupling hole 22b may limit the range of the upward and downward movement of the coupling member, and by setting the upward and downward movement range of the coupling member, the upward and downward movement range of the moving bracket 22 may be limited. In addition, the moving bracket 22 may include a rear protrusion 22c protruding rearward of the support bracket 20.

The rear protrusion 22c may move upward and downward within a cover hole 23a of the bracket cover 23. Similar to the coupling hole 22b, the cover hole 23a may limited the range of upward and downward movement of the rear protrusion 22c. As the cover hole 23a sets the upward and downward movement range of the rear protrusion 22c, the upward and downward movement range of the moving bracket 22 may be limited. The upward and downward movement range of the moving bracket 22 may be limited by a hole having a smaller upward and downward movement range between the coupling hole 22b and the cover hole 23a.

The user may insert the upper protrusion 21a into the upper groove 13, position the lower protrusion 22a to correspond to the lower groove 14, and then grasp the rear protrusion 22c to move the rear protrusion 22c upward, so that the support bracket 20 is coupled to the rear surface of the display module 10. As the rear protrusion 22c is moved upward, the support bracket 20 may be inserted into a bracket groove provided on the rear surface of the display module 10. When the user releases the rear protrusion 22c with the support bracket 20 being inserted into the bracket groove, the moving bracket 22 may be moved downward by the elastic force of the elastic member, and the lower protrusion 22a may be inserted into the lower groove 14. As the upper protrusion 21a is inserted into the upper groove 13 and the lower protrusion 22a is inserted into the lower groove 14, the support bracket 20 may be coupled to the rear surface of the display module 10.

The guide bracket 24 may rotate together with the rotating bracket 21 and the bracket cover 23. The guide bracket 24 may rotate together with the display module 10. The guide bracket 24 may include a link guide portion 24b. The link guide portion 24b will be described below. In addition, the guide bracket 24 may further include a locking groove 24a.

The fixed bracket 25 may be provided to not rotate with respect to the support stand 30, even when the display module 10 rotates. The fixed bracket 25 may be coupled to the support arm 100. As the fixed bracket 25 is coupled to the support arm 100, the support bracket 20 and the support arm 100 may be coupled to each other.

A first fixing member 26 and a second fixing member 27 may be provided to couple the rotating bracket 21 and the fixed bracket 25, respectively. The first fixing member 26 and the second fixing member 27 may be provided to pass through the rotating bracket 21 and the fixed bracket 25, respectively.

The first fixing member 26 may pass through a hole provided in the center of the rotating bracket 21. An end portion of the first fixing member 26 having passed through the rotating bracket 21 may be coupled to a first fixing head 26a. The first fixing head 26a may have a diameter larger than that of the hole so as not to pass through the hole of the rotating bracket 21.

The second fixing member 27 may pass' through a guide hole 21b of the rotating bracket 21 and a through hole of the fixed bracket 25. A rear end of the second fixing member 27 protruding to the rear side of the support bracket 20 by passing through the guide hole 21b and the through hole may be coupled to a second fixing head 27a. The second fixing head 27a may have a diameter larger than the width of the guide hole 21b and the size of the through hole so as not to pass through the guide hole 21b and the through hole.

The second fixing member 27 may be located in the guide hole 21b of the rotating bracket 21. Because the guide hole 21b is provided in an arc shape, even when the second fixing member 27 that does not rotate together with the display module 10 is located in the guide hole 21b, the rotating bracket 21 may rotate together the display module 10. In this regard, because the guide hole 21b is provided in an arc-shape, the second fixing member 27 may not restrict the rotation of the rotating bracket 21.

Figure 8:
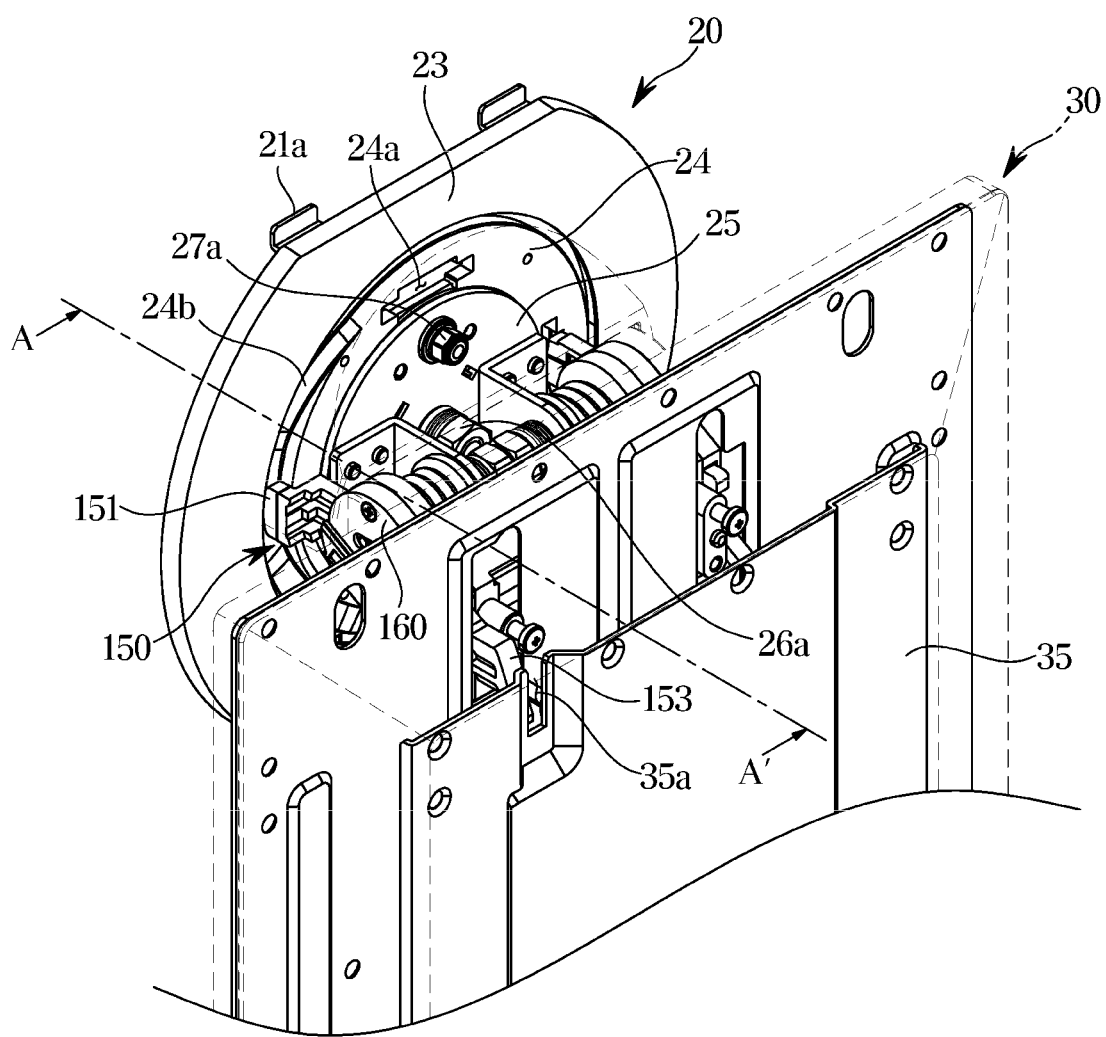
FIG. 8 is a view illustrating an internal structure of a support arm and a support stand when a vertical movement range of a display module is not limited in a display apparatus according to an embodiment.
Figure 9:
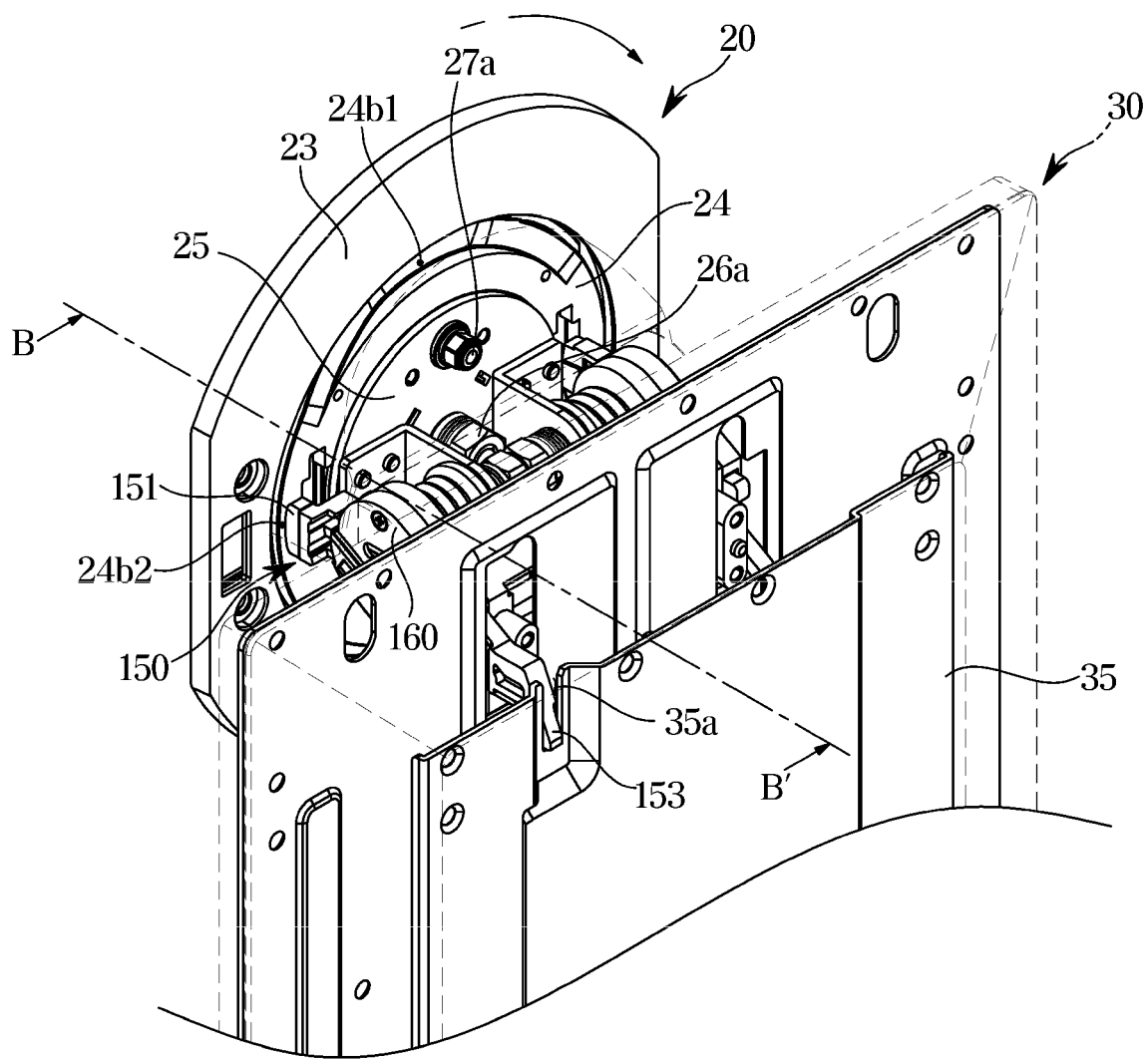
FIG. 9 is a view illustrating an internal structure of a support arm and a support stand when a vertical movement range of a display module is limited in a display apparatus according to an embodiment.

FIG. 8 is a view illustrating an internal structure of a support arm and a support stand when a vertical movement range of a display module is not limited within the support stand 30 of a display apparatus according to an embodiment. FIG. 9 is a view illustrating an internal structure of a support arm and a support stand when a vertical movement range of a display module is limited within the support stand 30 of a display apparatus according to an embodiment.

Hereinafter, operations of the support arm 100 and the support stand 30 according to an embodiment will be described with reference to FIGS. 8 and 9.

Referring to FIG. 8, the support arm 100 according to an embodiment may include a limiting link 150 provided to be movable in the frontward and backward directions within a predetermined range. The support stand 30 may include a limiting groove 35*a* in which the limiting link 150 is selectively inserted. The support stand 30 may include a reinforcing plate 35 including the limiting groove 35*a* and configured to reinforce the strength of the support stand 30. The limiting groove 35*a* may be provided on an upper end of the reinforcing plate 35. The limiting groove 35*a* may be provided so that an upper side thereof is open so as not to limit the upward movement of the limiting link 150 to be described below.

Referring to FIG. 8, when the display module 10 is arranged in the landscape orientation, the limiting link 150 of the support arm 100 may not be inserted into the limiting groove 35*a* of the support stand 30. Specifically, the limiting link 150 may be spaced apart from the limiting groove 35*a* in the front and rear side direction so as not to extend into the limiting groove 35*a*.

Referring to FIG. 9, when the display module 10 is disposed in the portrait orientation, the limiting link 150 of the support arm 100 may be inserted into the limiting groove 35*a* of the support stand 30. Upon the limiting link 150 being inserted into the limiting groove 35*a*, the vertical movement range of the limiting link 150 may be limited by the limiting groove 35*a*. The limiting link 150 inserted into the limiting groove 35*a* may be limited in a downward movement within the predetermined range. This is because the limiting link 150 is in contact with the reinforcing plate 35 and thus limited in a downward movement.

Referring to FIGS. 8 and 9, when the display module 10 rotates from the landscape orientation to the portrait orientation, the limiting link 150 may be moved backward and thus inserted into the limiting groove 35*a*. Conversely, when the display module 10 rotates from the portrait orientation to the landscape orientation, the limiting link 150 may be moved forward and thus withdrawn from the limiting groove 35*a*.

When the display module 10 rotates, a guide protrusion 151 provided at a front end of the limiting link 150 may be kept in contact with the link guide portion 24*b* of the support bracket 20. The link guide portion 24*b* may be provided in an arc shape and have different heights in the front and rear side directions along the circumferential direction. With such a structure, the link guide portion 24*b* may guide the guide protrusion 151 to move forward or backward when the guide protrusion 151 rotates.

The link guide portion 24*b* may be provided to be in contact with the guide protrusion 151 when the display module 10 rotates. The link guide portion 24*b* may be provided in a substantially semicircular shape in consideration of the rotation of the display module 10 in both directions. The link guide portion 24*b* may be formed to be depressed forward with respect to the guide bracket 24, as shown in FIGS. 8 and 9. The depression is referred to a link guide groove. Alternatively, the link guide portion may be formed to protrude rearward from the guide bracket 24. The protrusion is referred to a link guide protrusion.

When the display module 10 is arranged in the landscape orientation, the link guide portion 24*b* may be maximally depressed forward or minimally protruded backward. When the display module 10 is arranged in the portrait orientation, the link guide portion 24*b* may be minimally depressed forward or maximally protruded backward. When the display module 10 is arranged in the landscape orientation, a point at which the link guide portion 24*b* meets the guide protrusion 151 is referred to as a first point 24*b*1. At the first point 24*b*1, the link guide portion 24*b* may be maximally depressed forward or minimally protruded backward. When the display module 10 is arranged in the portrait orientation, a point at which the link guide portion 24*b* meets the guide protrusion 151 is referred to as a second point 24*b*2. At the second point 24*b*2, the link guide portion 24*b* may be minimally depressed forward or maximally protruded backward.

Figure 10:
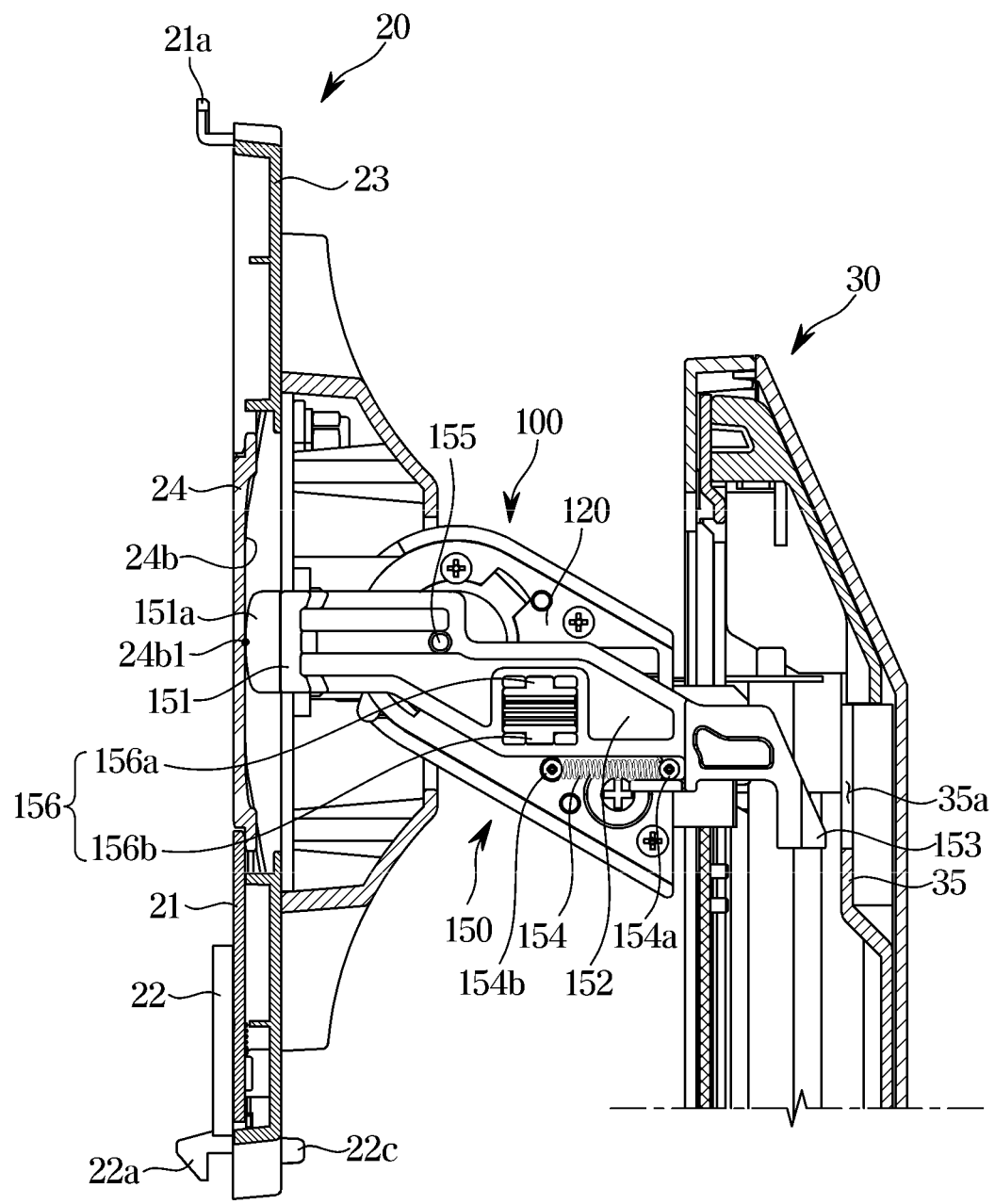
FIG. 10 is a cross-sectional view taken along line A-A' of FIG. 8 according to an embodiment.
Figure 11:
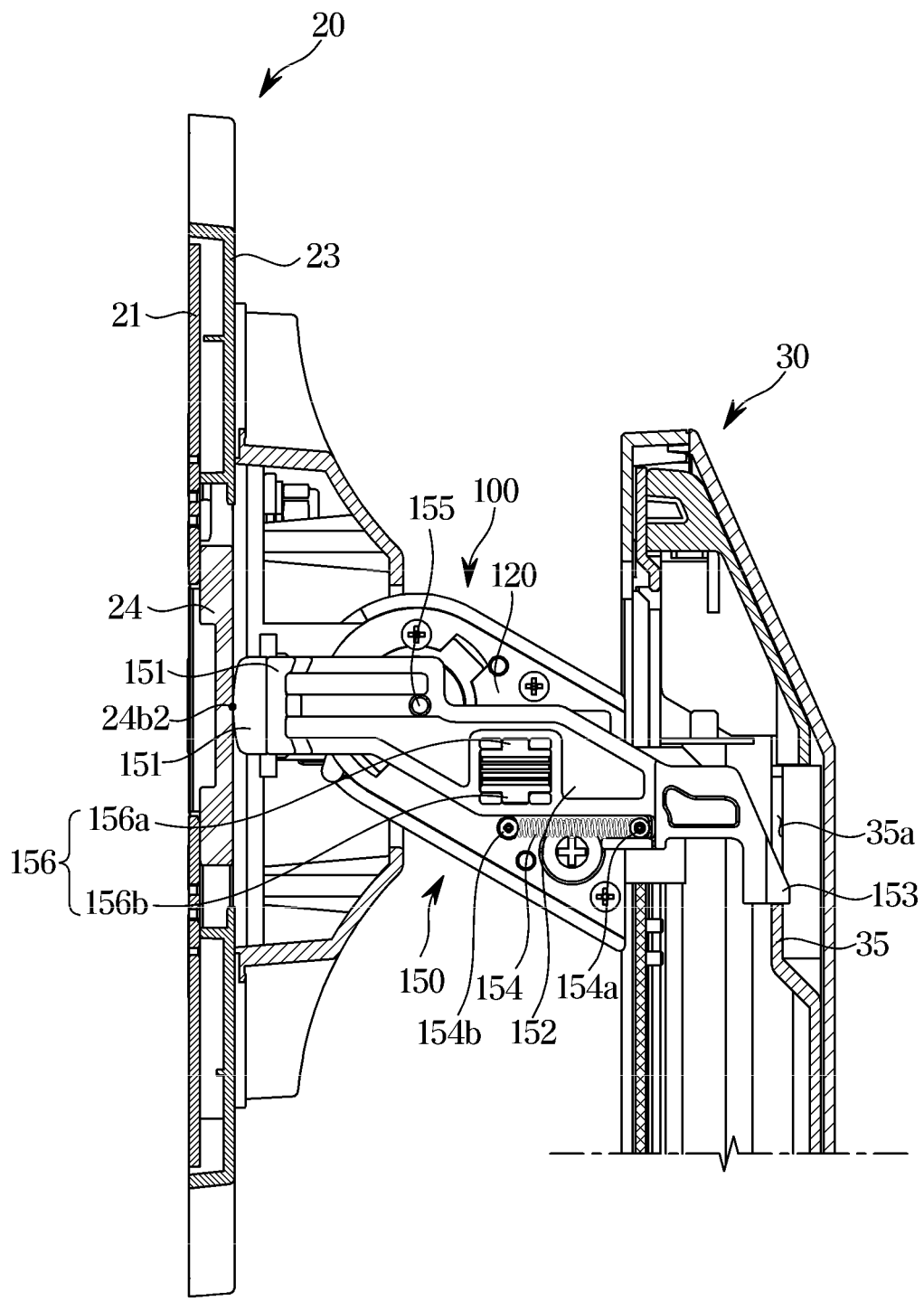
FIG. 11 is a cross-sectional view taken along line B-B' of FIG. 9 according to an embodiment.

FIG. 10 is a cross-sectional view taken along line A-A' of FIG. 8. FIG. 11 is a cross-sectional view taken along line B-B' of FIG. 9.

Referring to FIGS. 10 and 11, the support arm 100 may include a second fixing link 120 that is coupled to the support stand 30 to be movable in the vertical direction and a limiting link 150 provided to be moved forward and backward with respect to the second fixing link 120. In addition, the support arm 100 may include an elastic member 154, such as an elastic band or an elastic cord, or by a spring, for providing an elastic force so that the limiting link 150 is moved forward with respect to the second fixing link 120.

The limiting link 150 may include a guide protrusion 151 provided at a front end of the limiting link 150 and provided to move along the link guide portion 25*b*, a link body 152 extending to the rear side of the guide protrusion 151, and a limiting protrusion 153 formed at a rear end of the link body 152 and provided to be inserted into or withdrawn from the limiting groove 35*a*.

The guide protrusion 151 may include a protrusion cover 151*a* provided to cover a portion of the guide protrusion 151 to reduce frictional force with the link guide portion 24*b*. The protrusion cover 151*a* may be formed of a material capable of reducing friction with the link guide portion 24*b*, and there is no limitation on the material. In addition, a portion of the guide protrusion 151 may be exposed through the protrusion cover 151*a*. The protrusion cover 151*a* may refer to a configuration formed of a material different from that of the guide protrusion 151 and provided at a front end of the guide protrusion 151.

The support arm 100 may include the elastic member 154 for providing an elastic force so that the limiting link 150 is moved forward with respect to the second fixing link 120. The elastic member 154 may elastically bias the limiting link 150 to be moved forward. In order for the limiting link 150 to be moved forward by the elastic force of the elastic member 154, one end 154*a* of the elastic member 154 may be connected to the limiting link 150, and the other end 154*b* of the elastic member 154 may be connected to the second fixing link 120.

According to one embodiment, upon the limiting protrusion 153 being inserted into the limiting groove 35*a*, the distance between the one end 154*a* of the elastic member 154 and the other end 154*b* of the elastic member 154 may have a maximum distance. Upon the limiting protrusion 153 being withdrawn from the limiting groove 35*a*, the distance between the one end 154a of the elastic member 154 and the other end 154b of the elastic member 154 may have a minimum distance. The elastic member 154 may provide an elastic force so that the distance between the one end 154a and the other end 154b is shortened. The elastic member 154 may include a tension spring.

The limiting link 150 may include a first sliding protrusion 155 and a second sliding protrusion 156 provided to slide with respect to a cover link 160 to be described below. The first sliding protrusion 155 and the second sliding protrusion 156 will be described below.

Referring to FIG. 10, in a state in which the display module 10 is arranged in the landscape orientation, the guide protrusion 151 may be in contact with the first point 24b1 of the link guide portion 24b. As described above, the link guide portion 24b at the first point 24b1 may be maximally depressed forward. That is, the link guide portion 24b may have a maximum depth in the forward direction. As the link guide portion 24b is maximally depressed forward, the limiting link 150 in contact with the link guide portion 24b may be maximally moved forward. When the limiting link 150 is maximally moved forward, the limiting protrusion 153 may be spaced forward from the limiting groove 35a. When the limiting protrusion 153 is spaced forward from the limiting groove 35a, even with a downward movement of the support arm 100, the limiting protrusion 153 does not extend into the limiting groove 35a. That is, the downward movement range of the support arm 100 is not limited by the limiting protrusion 153.

Referring to FIG. 11, in a state in which the display module 10 is arranged in the portrait orientation, the guide protrusion 151 may be in contact with the second point 24b2 of the link guide portion 24b. As described above, the link guide portion 24b at the second point 24b2 may be minimally depressed forward. That is, the link guide portion 24b may have a minimum depth in the forward direction. As the link guide portion 24b is minimally depressed forward, the limiting link 150 in contact with the link guide portion 24b may be maximally moved rearward. When the limiting link 150 is maximally moved rearward, the limiting protrusion 153 may be inserted into the limiting groove 35a. When the limiting protrusion 153 is inserted into the limiting groove 35a, the limiting protrusion 153 does extend into the limiting groove 35a, and a downward movement of the support arm 100 may be limited.

Figure 12:
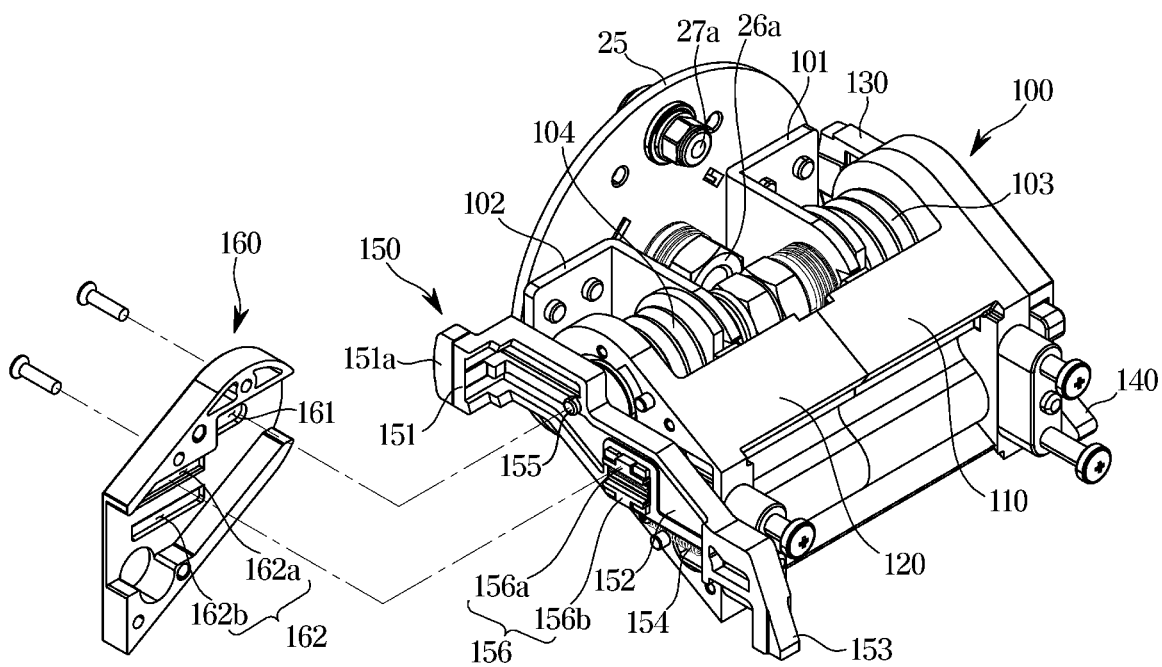
FIG. 12 is a diagram illustrating an internal structure of a support arm of a display apparatus according to an embodiment.
Figure 13:
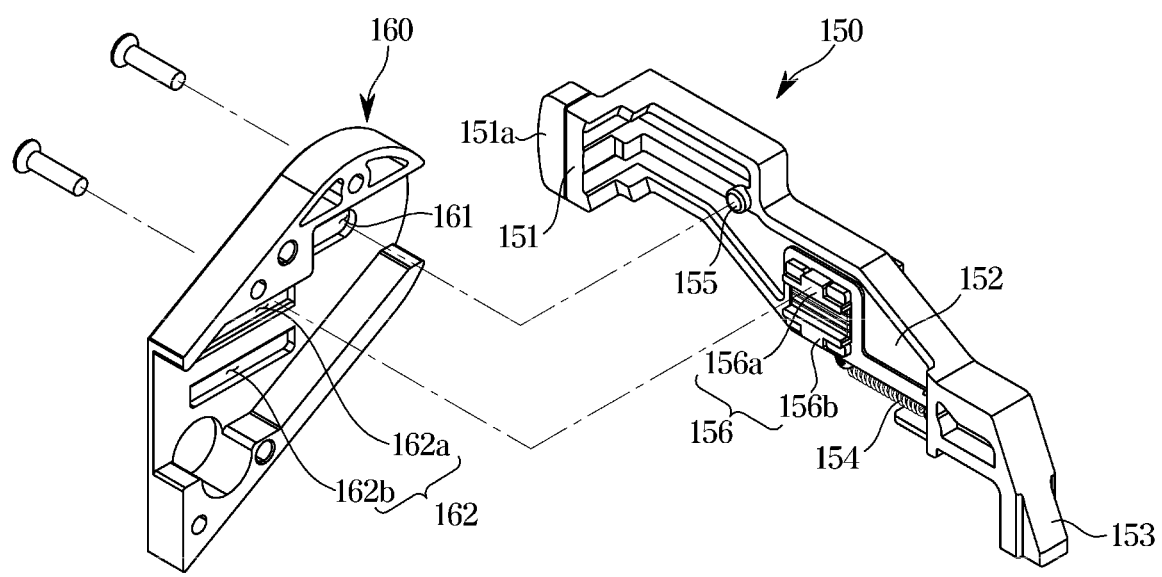
FIG. 13 is a view illustrating a limiting link and a cover link according to an embodiment.

FIG. 12 is a diagram illustrating an internal structure of a support arm of a display apparatus according to an embodiment. FIG. 13 is a view illustrating a limiting link and a cover link shown in FIG. 12.

Referring to FIGS. 12 and 13, the support arm 100 may include a first bracket 101 and a second bracket 102 provided to be coupled to the fixed bracket 25. The first bracket 101 and the second bracket 102 may be coupled to the fixed bracket 25 by a fastening member. As the first bracket 101 and the second bracket 102 are coupled to the fixed bracket 25, the support arm 100 and the support bracket 20 may be coupled to each other.

The support arm 100 may include a first fixing link 110 and a second fixing link 120 that are coupled to the support stand 30 to be vertically movable. The first fixing link 110 and the second fixing link 120 may be laterally arranged side by side. The first fixing link 110 and the second fixing link 120 may be coupled to each other by a fastening member.

The support arm 100 may include a first spring 103 disposed between the first fixing link 110 and the first bracket 101 and a second spring 104 disposed between the second bracket 102 and the second fixing link 120. The first spring 103 and the second spring 104 may include a torsion spring.

The support arm 100 may support the support bracket 20 to be rotatably movable within a predetermined range with respect to a rotation axis that extends in a leftward and rightward direction. Such rotational movement is referred to as a tilt. The support arm 100 may support the support bracket 20 to enable a tilt operation, thereby supporting the display module 10 coupled to the support bracket 20 to enable a tilt operation.

The first spring 103 and the second spring 104 may provide an elastic force such that the display module 10 is maintained in a fixed state at any position within a tilting range of the display module 10.

The support arm 100 may include the cover link 160 that covers a side surface of the limiting link 150. The cover link 160 may be provided to cover one side surface of the limiting link 150. In addition, the cover link 160 may be provided to guide the forward and backward movement of the limiting link 150. The cover link 160 may be fixedly coupled to the second fixing link 120. Because the cover link 160 is fixed together with the second fixing link 120, the cover link 160 may be kept fixed regardless of the forward and backward movement of the limiting link 150.

The limiting link 150 may include the first sliding protrusion 155 protruding laterally from the link body 152. In addition, the limiting link 150 may include the second sliding protrusion 156 provided at a position spaced apart from the first sliding protrusion 155. The second sliding protrusion 156 may include an upper sliding protrusion 156a and a lower sliding protrusion 156b that are spaced apart from each other in the vertical direction.

The cover link 160 may include a first guide hole 161 for guiding a sliding movement of the first sliding protrusion 155. In addition, the cover link 160 may include a second guide hole 162 for guiding a sliding movement of the second sliding protrusion 156. The second guide hole 162 may include an upper guide hole 162a into which the upper sliding protrusion 156a is inserted and a lower guide hole 162b into which the lower sliding protrusion 156b is inserted.

According to embodiments, a display apparatus capable of preventing a display module from colliding with a floor surface due to a downward movement can be provided.

According to embodiments, a display apparatus in which a display module in a landscape orientation has a vertical movement range different from that of the display module in a portrait orientation can be provided.

According to embodiments, a display apparatus including a support device for limiting a vertical movement range of a display module in a portrait orientation can be provided.

Although aspects of embodiments have been shown and described, it will be appreciated by those skilled in the art that changes and modifications may be made without departing from the principles and scope of the disclosure, the scope of which is defined in the claims and their equivalents.

What is claimed is:

1. A display apparatus comprising:
    a display panel;
    a support bracket comprising a sloped surface, wherein the support bracket is configured to rotate between a first orientation in which a long side of the display panel is laterally disposed and a second orientation in which the long side of the display panel is longitudinally disposed;

a support arm coupled to the support bracket and supporting the display panel; and a support stand supporting the support arm and including a limiting groove configured to limit a downward movement of the support arm, the support stand being configured to allow the support arm to move along a vertical direction, wherein the support arm comprises a limiting link configured to be in a first position that the limiting link is not caught in the limiting groove when the display panel is in the first orientation and a second position that the limiting link is caught in the limiting groove when the display panel is in the second orientation, and wherein the limiting link comprises:
- a guide protrusion in contact with a link guide portion of the support bracket and configured to slide along the link guide portion to guide the limiting link to move between the first position and the second position as the display panel rotates;
- a link body extending from the guide protrusion; and
- a limiting protrusion extending from the link body, and configured to be positioned capable of contacting the limiting groove or be spaced from the limiting groove based on a position of the guide protrusion.

2. The display apparatus of claim 1, wherein the support arm further comprises a fixing link coupled to the support stand to be movable upward and downward, and wherein the limiting link is provided to be movable forward and backward with respect to the fixing link.

3. The display apparatus of claim 2, wherein the limiting link is movable downwardly with respect to the limiting groove by moving away from the support stand along a horizontal direction, and is restricted from moving downwardly with respect to the limiting groove by moving toward the support stand along the horizontal direction.

4. The display apparatus of claim 2, wherein the support arm further comprises an elastic member configured to bias the limiting link to the first position.

5. The display apparatus of claim 4, wherein one end of the elastic member is connected to the fixing link, and another end of the elastic member is connected to the limiting link.

6. The display apparatus of claim 2, wherein the link guide portion includes the sloped surface which guides the limiting link to move between the first position and the second position as the display panel rotates.

7. The display apparatus of claim 6,
wherein the link body is slidably coupled to the fixing link.

8. The display apparatus of claim 7, wherein the link guide portion includes a link guide groove that is maximally depressed forward at a location of the guide protrusion when the display panel is in the first orientation and minimally depressed forward at a location of the guide protrusion when the display panel is in the second orientation.

9. The display apparatus of claim 8, wherein the link guide portion is configured to:
- guide the limiting link from the first position to the second position when the display panel rotates from the first orientation to the second orientation; and
- guide the limiting link from the second position to the first position when the display panel rotates from the second orientation to the first orientation.

10. The display apparatus of claim 7, wherein the link guide portion comprises a link guide protrusion that is minimally protruded backward when the display panel is in the first orientation and maximally protruded backward when the display panel is in the second orientation.

11. The display apparatus of claim 7, wherein when the limiting protrusion is caught into the limiting groove, a downward movement range of the display panel is limited within a first range, and when the limiting protrusion is spaced from the limiting groove so as not to be caught in the limiting groove, the limitation of the downward movement range of the display panel is limited within a second range that comprises the first range.

12. The display apparatus of claim 1, wherein the support stand comprises a reinforcing plate adjacent to a rear surface of the support stand inside the support stand, and configured to reinforce a strength, and wherein the limiting groove is defined by the reinforcing plate.

13. A display stand comprising:
- a support bracket configured to support a display panel and rotate between a first orientation and a second orientation, wherein the support bracket comprises a sloped surface;
- a support arm configured to support the support bracket and comprising a limiting link; and
- a support stand configured to slidably support the support arm within a first vertical range based on the limiting link being in a first position and to slidably support the support bracket within a second vertical range based on the limiting link being in a second position, wherein the first vertical range is different than and comprises the second vertical range, and wherein the limiting link comprises:
- a guide protrusion in contact with a link guide portion of the support bracket and configured to slide along the link guide portion to guide the limiting link to move between the first position and the second position as the display panel rotates;
- a link body extending from the guide protrusion; and
- a limiting protrusion extending from the link body, and configured to be positioned capable of contacting a limiting groove of the support stand or be spaced from the limiting groove based on a position of the guide protrusion.

14. The display stand of claim 13, wherein the limiting link is configured to move along a horizontal direction relative to the support stand based on the support bracket rotating between the first orientation and the second orientation.

15. The display stand of claim 14, wherein the support stand comprises a reinforcing plate which defines a groove.

16. The display stand of claim 15, wherein the limiting link is offset from the groove along a vertical direction based on the support bracket being in the first orientation, and wherein the limiting link overlaps the groove along the vertical direction based on the support bracket being in the second orientation.

17. The display stand of claim 16, wherein the limiting link is configured to contact a lower surface of the groove based on the support arm being positioned at a lower end of the second vertical range while the support bracket is in the second orientation.

18. A method of limiting vertical motion of a support bracket with respect to a support stand, the method comprising:
- allowing the support bracket to vertically move along the support stand within a first vertical range based on the support bracket being in a first orientation;

rotating the support bracket from the first orientation to a second orientation;

sliding a guide protrusion of a support arm provided between the support bracket and the support stand, along a sloped surface of the support bracket as the support bracket rotates from the first orientation to the second orientation; and moving a limiting protrusion of the support arm into a limiting groove of the support stand as the guide protrusion slides along the sloped surface to limit vertical movement of the support bracket to a second vertical range, wherein the first vertical range is different than and comprises the second vertical range, and wherein the guide protrusion and the limiting protrusion extend from a link body of the support arm.

19. The method of claim 18, wherein the moving comprises moving the limiting protrusion from a first position that is offset from the limiting groove along a vertical direction, to a second position that overlaps the limiting groove along the vertical direction, based on the support bracket rotating from the first orientation to the second orientation.

* * * * *